US00RE36113E

United States Patent [19]

Brueck et al.

[11] E Patent Number: Re. 36,113

[45] Reissued Date of Patent: Feb. 23, 1999

[54] METHOD FOR FINE-LINE INTERFEROMETRIC LITHOGRAPHY

[75] Inventors: Steven R. J. Brueck; Saleem Zaidi; An-Shyang Chu, all of Albuquerque, N. Mex.

[73] Assignee: The University of New Mexico, Albuquerque, N. Mex.

[21] Appl. No.: 635,565

[22] Filed: Apr. 22, 1996

Related U.S. Patent Documents

Reissue of:

[64] Patent No.: 5,415,835
Issued: May 16, 1995
Appl. No.: 945,776
Filed: Sep. 16, 1992

[51] Int. Cl.[6] ..... G03F 7/20

[52] U.S. Cl. ..... 430/311; 430/1; 430/394; 430/397; 430/945; 430/952; 250/492.11; 355/53; 355/77

[58] Field of Search ..... 430/1, 2, 311, 430/394, 396, 397, 945, 952; 250/492.11, 492.21; 355/18, 53, 43, 67, 77

[56] References Cited

U.S. PATENT DOCUMENTS

| | | | |
|---|---|---|---|
| 3,591,252 | 7/1971 | Lu | 430/396 |
| 4,375,315 | 3/1983 | Lacombat | 350/96.25 |
| 4,402,571 | 9/1983 | Cowan | 430/1 |
| 4,796,038 | 1/1989 | Allen | 354/4 |
| 4,859,548 | 8/1989 | Heise | 430/394 |
| 4,997,747 | 3/1991 | Yoshida | 430/1 |
| 5,142,132 | 8/1992 | Macdonald | 250/201.9 |
| 5,208,123 | 5/1993 | Ramsbottom | 430/2 |
| 5,448,332 | 9/1995 | Sakakibara | 355/53 |

OTHER PUBLICATIONS

Zhou: "Precise Periodicity Control in the Fabrication of Holographic Gratings" in Appl. Optics, 20(8), Apr. 1, 1981, pp. 1270–1272.

*Primary Examiner*—Kathleen Duda
*Attorney, Agent, or Firm*—Snell & Wilmer L.L.P.

[57] ABSTRACT

In microelectronic processing, the method of producing complex, two-dimensional patterns on a photosensitive layer with dimensions in the extreme submicron range. A photosensitive layer is first exposed to two beams of coherent radiation to form an image of a first interference pattern on the surface of the layer. The layer is subsequently exposed to one or more interference pattern(s) that differ from the first interference pattern in some way, such as by varying the incident angle of the beams, the optical intensity, the periodicity, rotational orientation, translational position, by using complex amplitude or phase masks in one or both of the coherent beams, or a combination of the above. Desired regions of the complex pattern thus produced are isolated with a further exposure of the photosensitive layer using any conventional lithography.

18 Claims, 10 Drawing Sheets

METHOD FOR FINE-LINE INTERFEROMETRIC LITHOGRAPHY

Matter enclosed in heavy brackets [ ] appears in the original patent but forms no part of this reissue specification; matter printed in italics indicates the additions made by reissue.

*The U.S. Government has a paid-up license in this invention and the right in limited circumstances to require the patent owner to license others on reasonable terms as provided for by the terms of Contract No. 502-MC-91 with Semantech and Contract No. AFOSR F490-89-C-0028 with the Air Force Office of Scientific Research.*

*This application is a reissue of Ser. No. 07/945,776, now U.S. Pat. No. 5,415,835.*

FIELD OF INVENTION

This invention relates to microelectronic circuits and more particularly to the use of interferometric patterning in optical lithography to produce complex, high density integrated circuit structures.

BACKGROUND OF THE INVENTION

The miniaturization of integrated circuits has been underway ever since the first demonstration of an integrated circuit Using dynamic random access memory (DRAM) as a benchmark, current expectations of device generations, dates of peak production, and lithography critical dimension are: (4 Mb, 1994, 0.8 μm); (16 Mb, 1997, 0.5 μm); (64 Mb, 1999, 0.35 μμ); (256 Mb, 2003, 0.25 μm) and (1 Gb, 2006, 0.15 μm) [projections from R. J. Kopp, Semiconductor International 15, 34–41 (1992)]. In the industry news section in the same issue of this trade magazine (page 11), there is a report of a MICROTECH 2000 workshop cosponsored by the National Advisory Committee on Semiconductors (NACS) and the Office of Science and Technology Policy (OSTP). The reported recommendation relative to lithography is: "An experimental lithography capability that can print features of 0.10 to 0.15 μm will be required by 1994 in sufficient volumes to allow essential process and manufacturing equipment development This need may require new electron-beam mask or direct wafer writing tools, or a capability in advanced X-Ray or phase-shift optical lithography. Research and development for several lithography alternatives will have to be supported for the next several few years to determine what system is best suited for production."

Imaging optical lithography, in which a mask image is projected onto a photoresist layer on the wafer, dominates today's manufacturing. Two equations describing the optical diffraction of the optical system determine the characteristics of the image. The minimum resolution, r, is proportional to the lens numerical aperture, or $$r \sim 1/NA$$

and the depth of focus (DOF)

$$DOF \sim 1/(NA)^2$$

where 1 is the wavelength and NA the lens numerical aperture. These simple equations point out some of the difficulties in extending optical lithography to the extreme submicrometer regime, ie., about 0.1 μm or 100 nm. Refractive optics are available only up to approximately 200 nm at shorter wavelengths almost all materials become strongly absorptive and unusable. There are several efforts underway to use reflective optics at short wavelengths. However, there remain significant materials problems, particularly at X-Ray wavelengths and the NAs of these systems are significantly lower than for refractive systems, giving away some of the wavelength advantage for imaging small areas.

Considerable interest and attention have been given to new X-ray lenses based on grazing incidence filamentary propagation through hollow "waveguides." This remains a difficult problem without a demonstration of a high-efficiency, high numerical aperture, manufacturable lens with a field-of-view that can accommodate today's growing field sizes. From the experience of longer wavelength optical lithography using refractive lenses, the optical train can easily be the most complex and expensive part of a lithography tool.

The progression to short wavelengths to improve the minimum resolution carries a concomitant penalty in the reduction of the depth-of-focus (DOF). This has motivated efforts at multilayer resists with strong absorption layers, as well as efforts at improved planarization of circuits to eliminate topographic variations that would cause different parts of the circuit to image at different heights. This small DOF is a major concern for submicrometer lithography.

Briefly, major issues facing extension of conventional lithography to the extreme submicron regime (0.1 μm) include: source technology (issues are uniformity, spectral bandwidth, repeatability, reliability, etc.); the imaging system (again refractive optics become impossible below ~200 nm and reflective optics have inherently smaller numerical apertures); the mask technology (there are significant issues related to vibration, heating and distortion in X-Ray masks which must be fabricated on pellicle substrates because of the strong X-Ray absorption of most materials); and the resist technology.

For many years periodic line and space gratings in the extreme submicron range have been fabricated by use of two interfering coherent beams. For two beams incident at angles $\theta$ and $-\theta$ to the surface normal, the period of the interference pattern is $\lambda/(2 \sin \theta)$. For readily available wavelengths (361-nm Ar-ion laser) and angles ($\theta \sim 75°$) this gives a period as small as 187 nm. The resulting grating pattern is a periodic line and space array; the critical dimensions of the lines are adjustable using nonlinearities in the expose and develop processes to roughly ⅓ of this dimension or 60 nm.

SUMMARY OF THE INVENTION

The present invention provides complex, two-dimensional patterns in integrated circuits through the use of multiple grating exposures on the same or different photoresist layers and the use of complex amplitude and phase masks in one or both of the beams of illuminating coherent radiation. ("Complex, two-dimensional patterns" as used herein means a pattern of multiple, interconnected and/or unconnected straight or curved lines or bodies spaced apart from each other. "Extreme submicron range" means distances of the order of 0.1 μm or 100 nm or less between lines.) Interferometric lithography may be combined with conventional lithography for the production of extreme submicrometer structures and the flexible interconnect technology necessary to produce useful structures. Generally, a critical dimension (CD) of the order of 60 nm with a pitch of 187 nm is obtainable through the process of the invention. Although with the use of a KrF excimer laser at 248 nm, a pitch of 124 nm and a CD of 41 nm can be attained. Further extension to a ArF excimer laser at 193 nm will proportionately reduce these dimensions. In general, as laser technology continues to evolve and results in shorter wavelength coherent sources, this technique can be adapted to produce still smaller structures.

In view of the close tolerances involved in producing patterns and microelectronic integrated circuits in accordance with the present invention, accurate alignment and position sensing is important. In that connection, the arrangements shown and described in Brueck et al. U.S. Pat. No. 4,987,461, and in Brueck et al. U.S. patent application Ser. No. 07/599,949, filed on Oct. 10, 1990, now U.S. Pat No. 5,343,292, may be used to particular advantage.

The photoresist exposure process of the invention takes advantage of the fact that, in terms of dimensional thicknesses of photoresists (typically 1–2 μm), there are no DOF limitations for the two interfering coherent optical beams. That is, for two interfering plane waves, there is no z or depth dependence of the pattern in the direction bisecting their propagation directions. For coherent optical beams, the depth of field dependence is set usually by the shorter of the beam cofocal parameter or, less usually, the laser coherence length. For larger laser spots the confocal parameter is many centimeters. For typical cw lasers, i.e. Ar-ion lasers at 361 nm, the laser coherence length is on the order of meters. The DOF of interferometric lithography is essentially unlimited on the micrometer scale of the thin-films employed in semiconductor manufacturing.

Another feature of the process in accordance with the invention involves the provision of large dimensions over which a sub-micron structure may be fabricated. Interferometrically defined gratings have long been available with dimensions up to 5×25 $cm^2$ or larger, approximately a factor of 10 larger in linear dimension than the typical field sizes of today's integrated circuits. Further, this can be achieved at ultraviolet wavelengths for which photoresist is already well developed.

BRIEF DESCRIPTION OF THE DRAWINGS

Reference is now made to the drawings in which like reference numerals refer to like parts and in which.

DETAILED DESCRIPTION OF THE INVENTION

Figure 1:
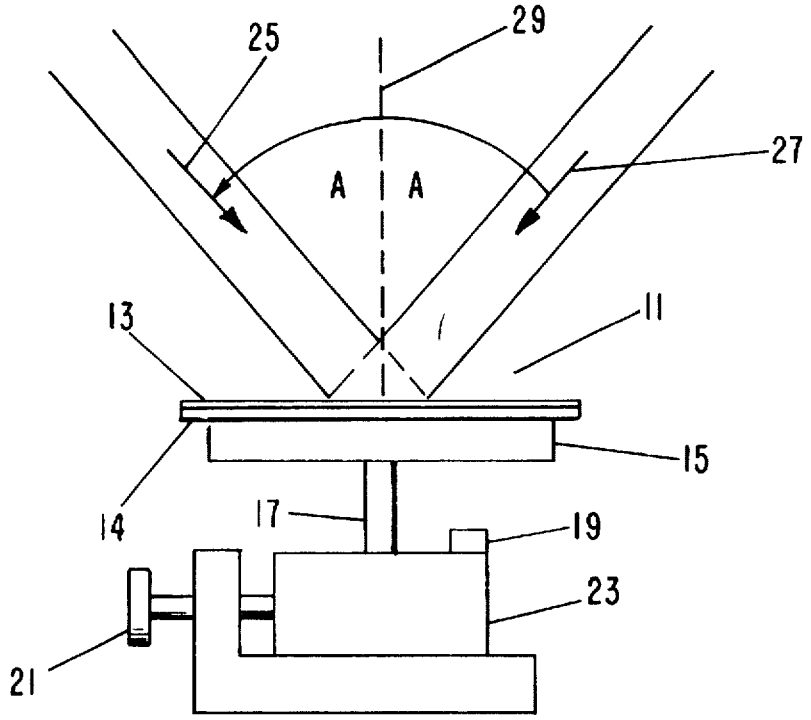
FIGS. 1 and 2 are diagrammatic views of alternative versions of apparatus employed to carry out the process of the invention.
Figure 2:
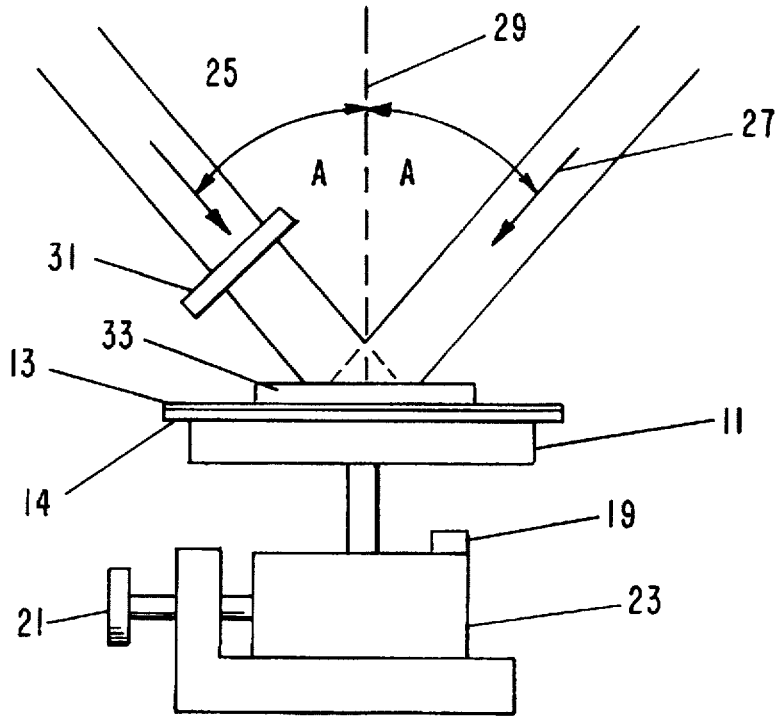

Referring to FIGS. 1 and 2, a wafer 11 having a photosensitive layer 13 and substrate 14 is positioned on a movable table 15. The table 15 is supported on a shaft 17 and is arranged to be rotated and translated in two-dimensions respectively via controls 19 and 21 which control mechanical rotational and translational motion producing motors and linkages generally indicated by the numeral 23. The motors and linkages 23 and controls 19 and 21 need not be shown in detail since they are well known in the art and may be of any suitable well known construction.

Coherent optical beams 25 and 27 provided by any suitable well known source or sources are directed at a variable angle A from the vertical or system axis 29 toward each other and toward the photoresist layer 13 to form an interference pattern on the photosensitive layer 13. The arrangement shown in FIG. 2 is identical to that of FIG. 1 with the addition of a phase-amplitude mask 31 in the path of beam 25 or a phase-amplitude mask 33 in the path of both beams 25 and 27 in their interference region at the surface of the photosensitive layer 13, or both The beams 25 and 27 of coherent radiation may be lasers and may be provided in any suitable well known manner so that they are from the same source and are essentially equal in intensity at the wafer which assures a high contrast exposure.

In accordance with the invention the complex interference pattern produced on the photoresist layer or layers is varied by (a) rotating the wafer, (b) translating the wafer, (c) both rotating and translating the wafer, (d) changing the angle A, (e) varying the number of exposures, (f) varying the optical intensity, (g) using a phase/amplitude mask in one or both illuminating beams of coherent radiation, or (h) employing any combination of (a)–(g). Further flexibility is offered by a combination of any of (a)–(g) with conventional or imaging lithography techniques as are well known.

As an alternative method, first a single or multiple set of interferometric exposures are carried out in photosensitive layer. The subsequent pattern is then developed and transferred to a semiconductor substrate by any of the well known commercially available techniques. This substrate is then again recoated with a photoresistive layer, and single or multiple exposure processes can be repeated with the aid of the alignment position sensing arrangement described in Brueck, et al. in U.S. Pat No. 4,987,461.

Figure 3:
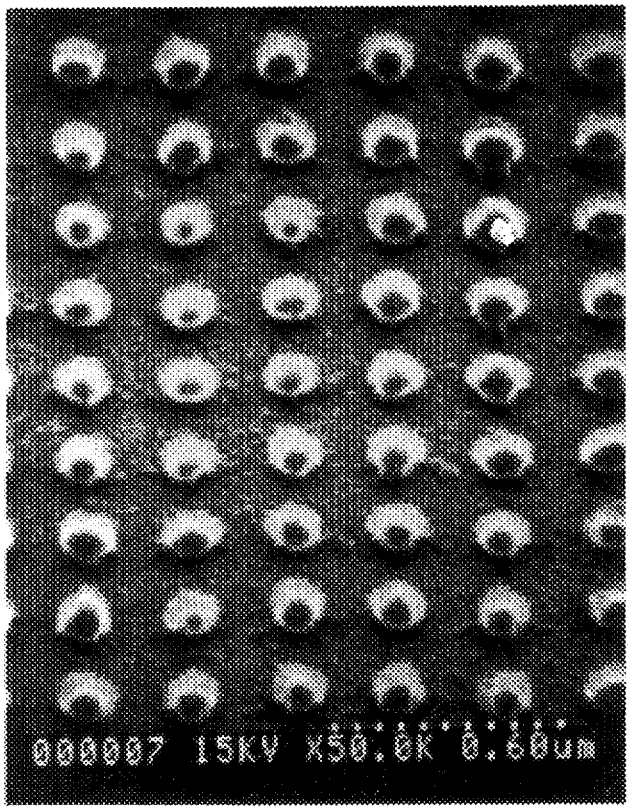
FIG. 3 is a scanning electron microscopic (SEM) view of an exposed and developed latent image in a photoresist from which patterns may be formed in a semiconductor wafer.

Referring to FIG. 3, the image depicted is a rectilinear array of circular dots on the photosensitive layer about 300 nm apart from each other in the x and y axes. The photoresist layer is developed and transferred into the Si sample by a plasma-etch process. The interiors of the circles are etched into the Si. A potentially very large scale application of structures such as this is in the fabrication of field-emission flat panel displays which require large fields (up to large-screen television size or greater) of submicrometer field emitter tips. This lithography is preferably be carried out on glass plates which are much less polished than today's Si wafers.

In accordance with the invention, the image of FIG. 3 is produced on the photosensitive layer 13 by two exposures of the layer to an interference pattern produced by the two coherent optical beams 25 and 27 as follows: With a wavelength of 488 nm for each laser beam 25 and 27 and angle A=50 degrees, the photosensitive layer is subjected to a first exposure with the period of the interference pattern being 0.3 microns and a second exposure with the same period and other parameters but with the wafer rotated 90 degrees about the axis 29. The length of each exposure depends upon the nature of the photoresist and the optical wavelength and intensity and, as an illustration, for a photoresist comprising KTI 1350, is about 60 seconds.

Figure 4:
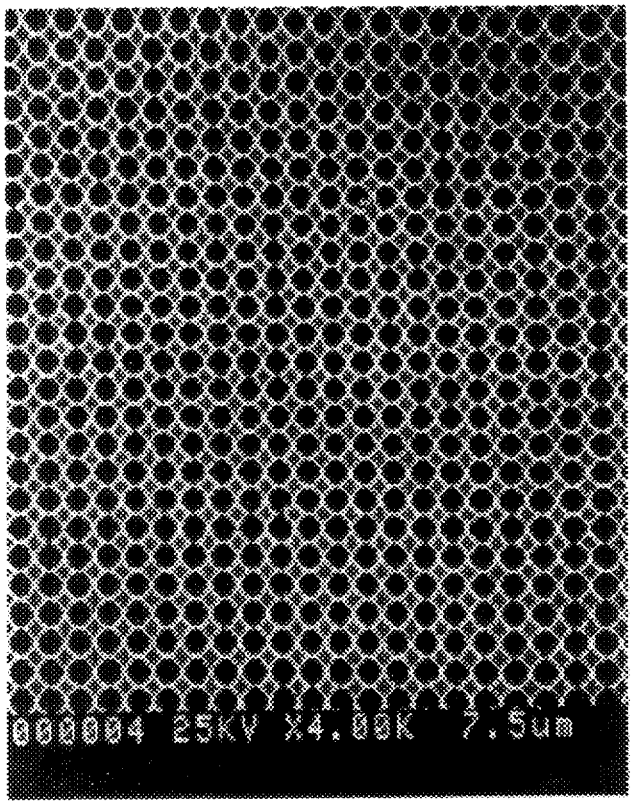
FIGS. 4–7 are SEM views of different complex two-dimensional patterns produced from the developed photoresist image in FIG. 3 in a semiconductor wafer depending on the kind of transfer process used.
Figure 5:
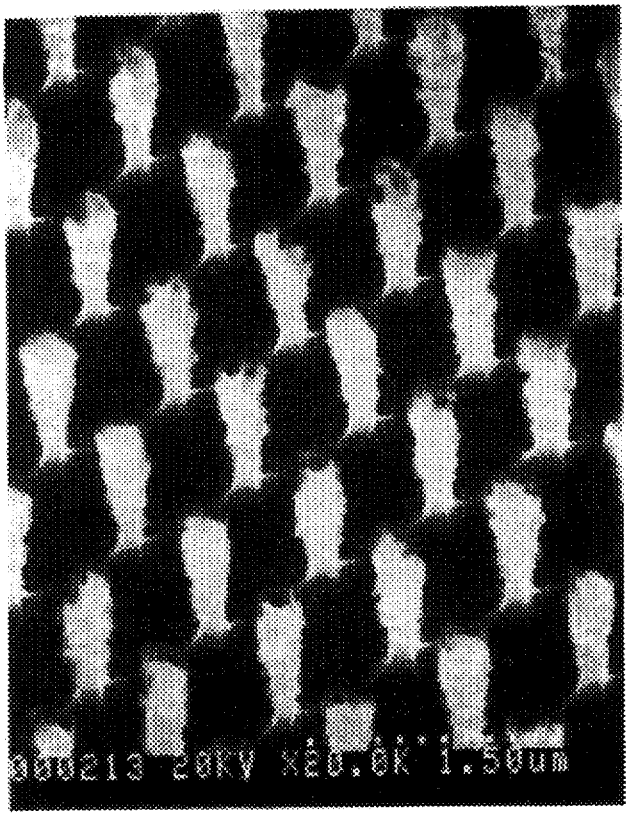
Figure 6:
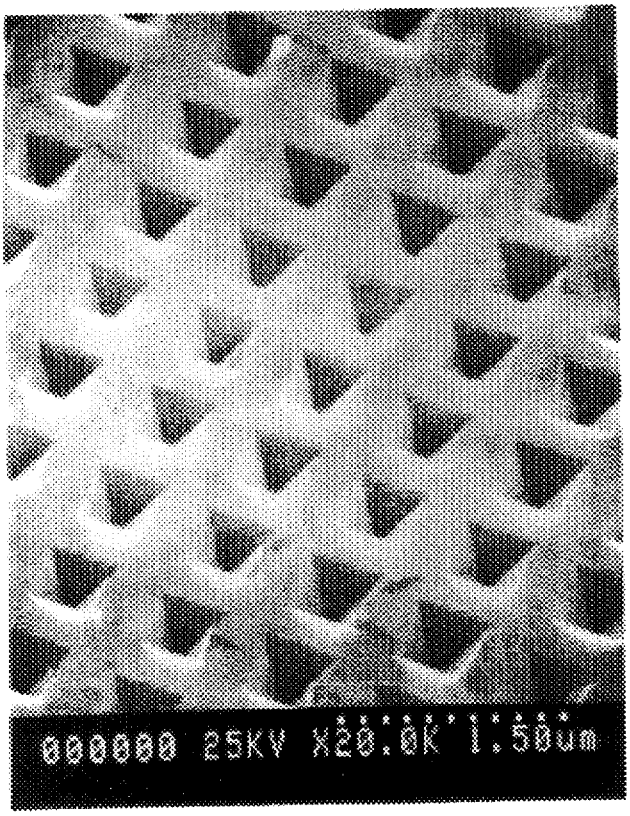
Figure 7:
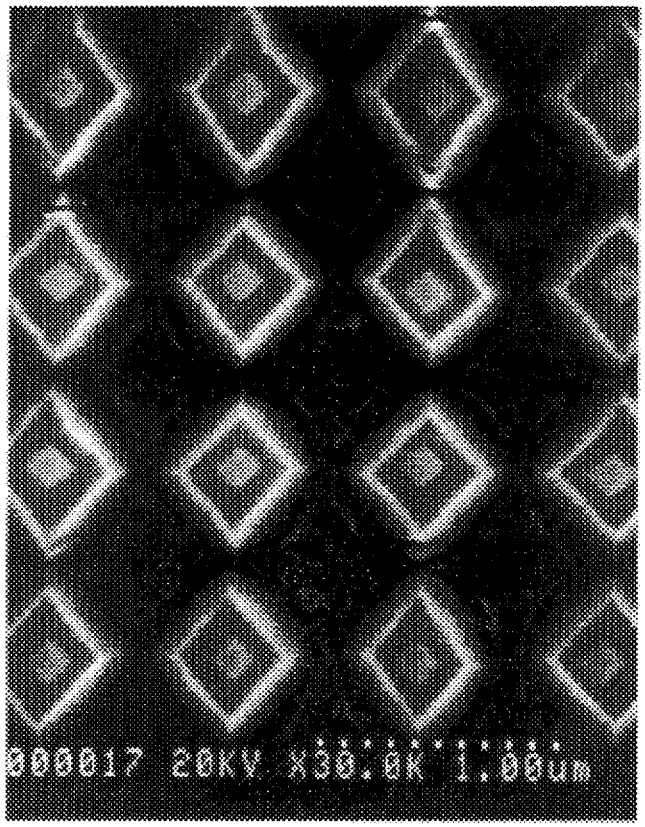
Figure 8:
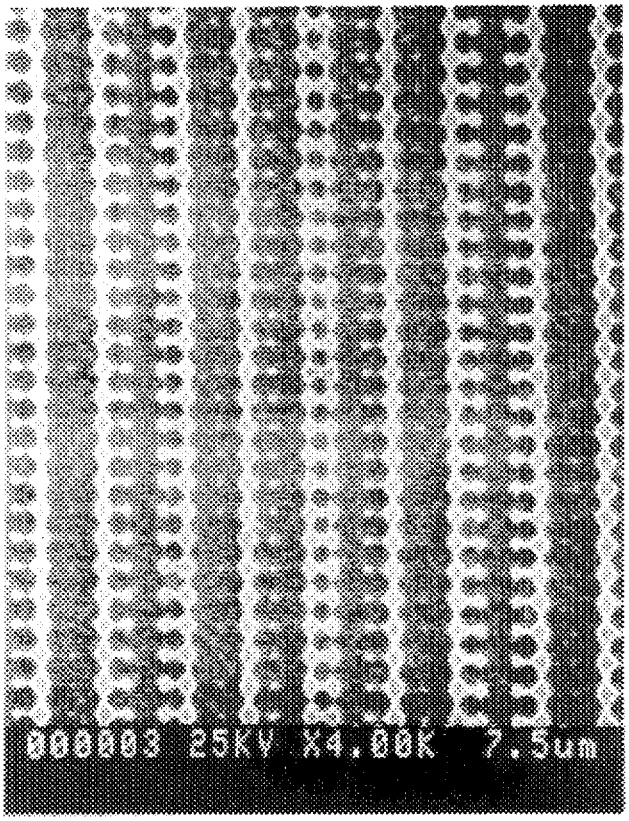
FIGS. 8–14 are SEM views of other complex two-dimensional patterns fabricated in semiconductive material in accordance with the invention.
Figure 9:
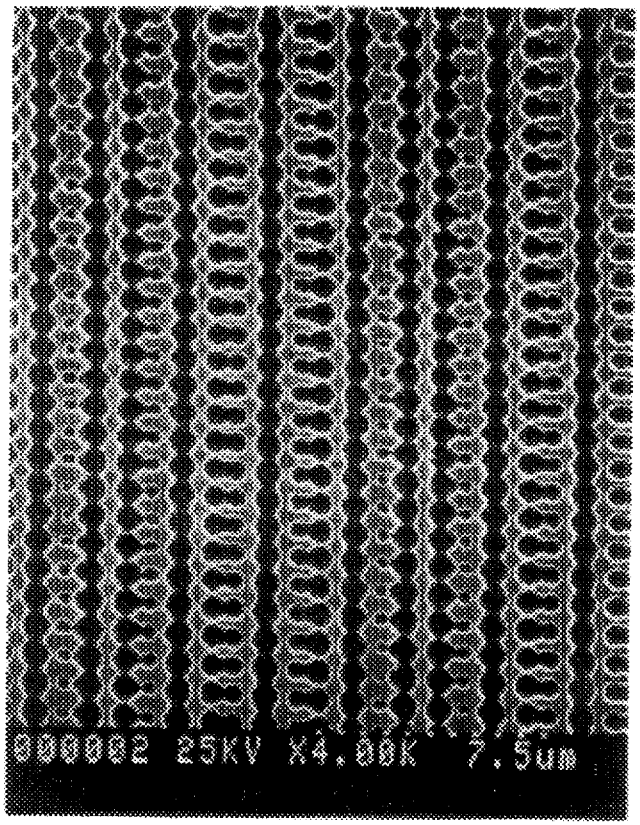
Figure 10:
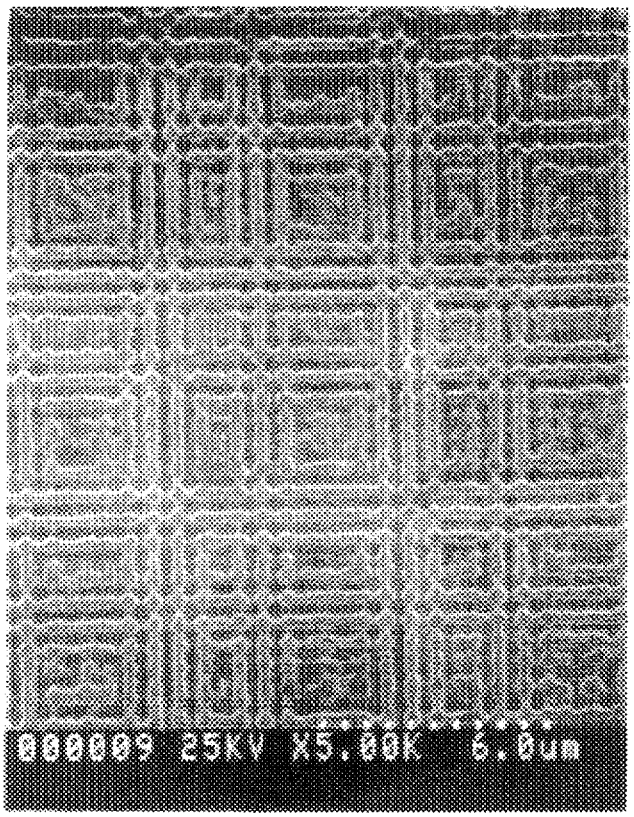
Figure 11:
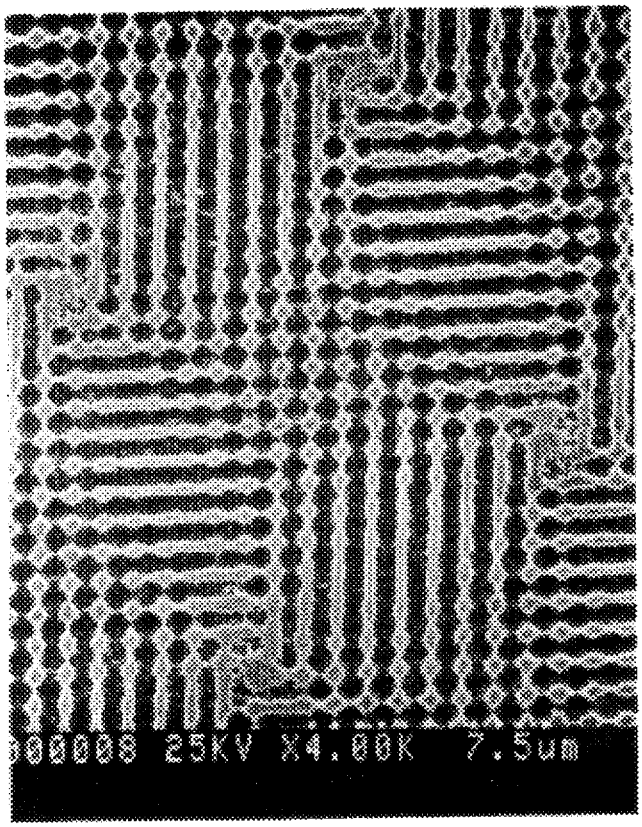
Figure 12:
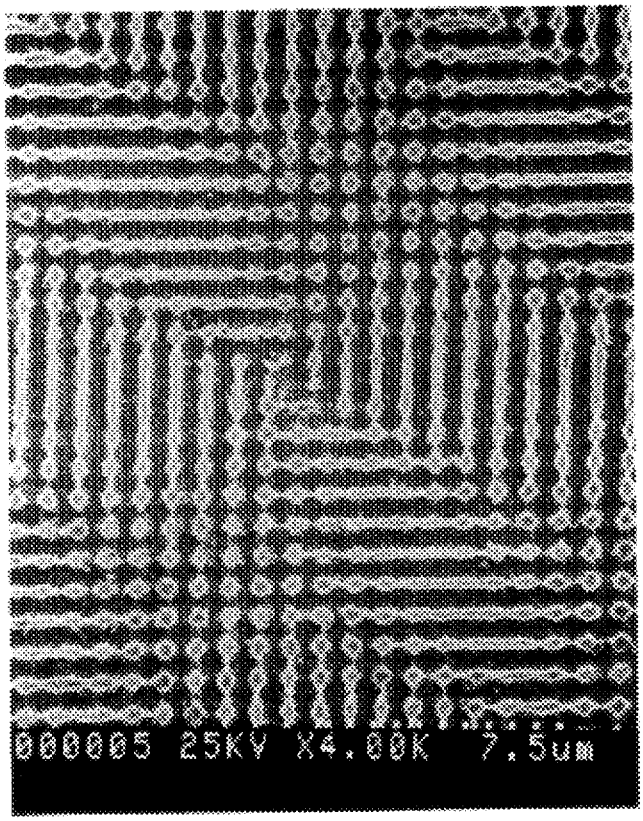
Figure 13:
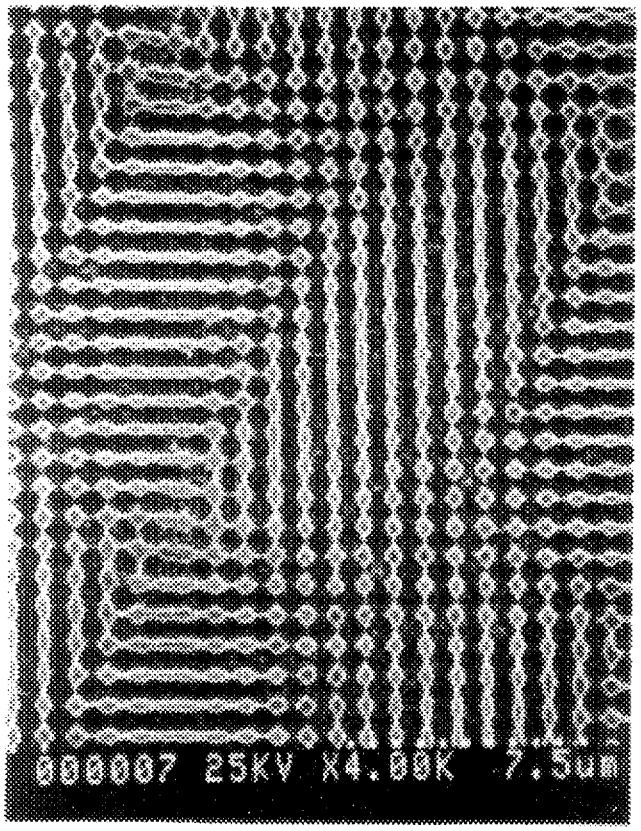
Figure 14:
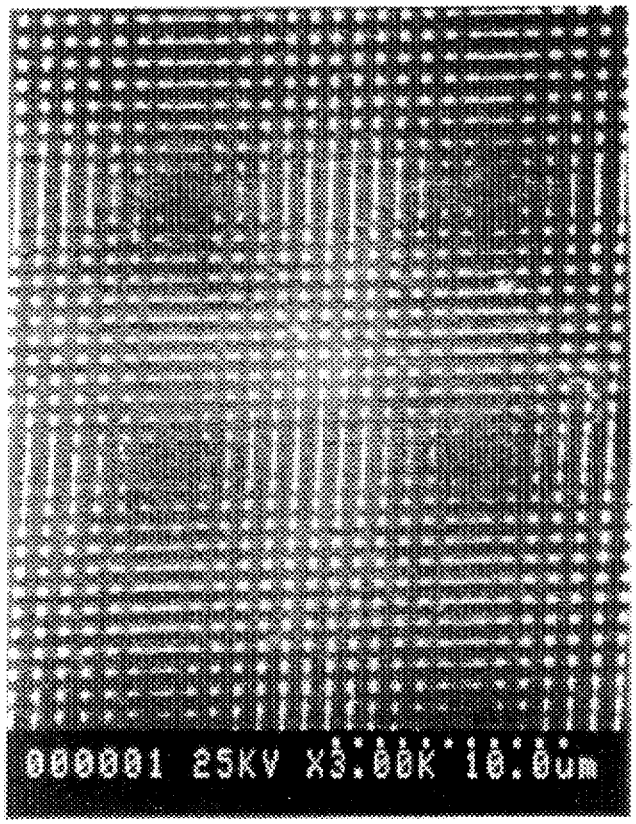

The pattern shown in FIG. 3 may then be transformed into the grating structure shown in FIGS. 4–7 by any of several well known processes as follows: FIG. 4—by plasma etching into silicon; FIG. 5—by reactive ion etching into GaAs; FIG. 6—by wet chemical etching into silicon, and FIG. 7—by ion beam milling into silicon.

Turning to FIGS. 8–14, the patterns shown therein are produced by plasma etching from photoresists having complex images thereon produced by the imaging scheme of the present invention as indicated in the following table 1:

TABLE 1

| FIG | Exposure | Period (mm) | Rotation (deg) | Beam Angle (deg) |
|---|---|---|---|---|
| 8 | First | 1.0 micron | 0-deg | 14-deg |
| | Second | 2.0 | 0-deg | 7-deg |
| | Third | 1.0 | 90-deg | 14-deg |
| | Fourth | 2.0 | 90-deg | 7-deg |
| 9 | First | 1.0 micron | 0-deg | 14-deg |
| | Second | 1.5 | 0-deg | 9.4-deg |
| | Third | 1.0 | 90-deg | 14-deg |
| | Fourth | 1.5 | 90-deg | 9.4-deg |
| 10 | First | 0.6 micron | 0-deg | 24-deg |
| | Second | 0.7 | 0-deg | 20.4-deg |
| | Third | 0.8 | 0-deg | 17.8-deg |
| | Fourth | 0.6 | 90-deg | 24-deg |
| | Fifth | 0.7 | 90-deg | 20.4-deg |
| | Sixth | 0.8 | 90-deg | 17.8-deg |
| 11 | First | 0.95 micron | 0-deg | 15-deg |
| | Second | 1.0 | 0-deg | 14-deg |
| | Third | 0.95 | 90-deg | 15-deg |
| | Fourth | 1.0 | 85-deg | 14-deg |
| 12 | First | 0.95 | 0-deg | 15-deg |
| | Second | 1.0 | 5-deg | 14-deg |
| | Third | 0.95 | 90-deg | 15-deg |
| | Fourth | 1.0 | 85-deg | 14-deg |
| 13 | First | 0.95 micron | 0-deg | 15-deg |
| | Second | 1.0 | 5-deg | 14-deg |
| | Third | 0.95 | 90-deg | 15-deg |
| | Fourth | 1.0 | 90-deg | 14-deg |
| 14 | First | 0.95 micron | 0-deg | 15-deg |
| | Second | 1.0 | 0-deg0 | 14-deg |
| | Third | 0.95 | 90-deg | 15-deg |
| | Fourth | 1.0 | 90-deg | 14-deg |

It is clear from the images produced in connection with FIGS. 3 thru 14 that, in accordance with the invention, many other complex patterns may be produced in the manner described. The examples discussed in connection with FIGS. 3–14 by no means exhaust the rich array of possibilities of patterns including those required for highly repetitive integrated circuit elements such as DRAMs Of course, for these applications an aperiodic wiring pattern must ultimately be superimposed on this structure in any suitable well-known manner. For DRAMS even the interconnection patter is highly regular since these circuits are usually addressed in a matrix fashion. Only at the periphery of the DRAM region do highly aperiodic patterns occur.

It is understood that in accordance with the invention a very wide range of structures that can be fabricated. The aerial image for each exposure is simply a sine function:

$$I(x)=A\{1+\sin(qx+\phi)\} \quad (1)$$

where the amplitude A, period 2p/q and phase f are set by the incident optical beams. Nolinearities in the exposure, develop and etch processes result in a higher-order terms in a Fourier series expansion at the same period and phase as the original image. That is:

$$S(x)=\Sigma A_n \sin(nqx+\phi) \quad (2)$$

where S(x) is the resulting pattern on the wafer and the coefficients $A_n$ are the result of these nonlinear processes. Most often, the $A_n$ will be a monotonically decreasing function of n. Finally, with multiple exposures the result for the pattern is:

$$S(\vec{r}\,r)=\Sigma\Sigma A_{nm} \sin(n\,\vec{q}\,q_m\cdot r+\phi_m). \quad (3)$$

This is a two-dimensional Fourier transform, and thus, in accordance with the invention, any pattern definable by the transform can be synthesized. As a practical matter, this is restricted in the range of $|\bar{9}m|$ to $4\pi/2$ and, of course, there is no independent control of each $A_{nm}$. Nevertheless, the transform provides the basic rule giving rise to the very large variety of patterns that may be realized through patterning in accordance with the principles of the invention.

Additional flexibility in pattern generation may be introduced through the use of amplitude and/or phase masks for one or both of the exposure beams. Phase/amplitude masks may take any desired form depending on the desired pattern. The mask 41 shown in FIG. 15 has two thickness-varied (i.e., path length-varied on the scale of the frequency of the coherent beam radiation), phase modification sections 43 and 45 and two amplitude or shadow or stenciled sections 47 and 49. Of course, a mask need only have phase or amplitude portions or both.

Figure 15:
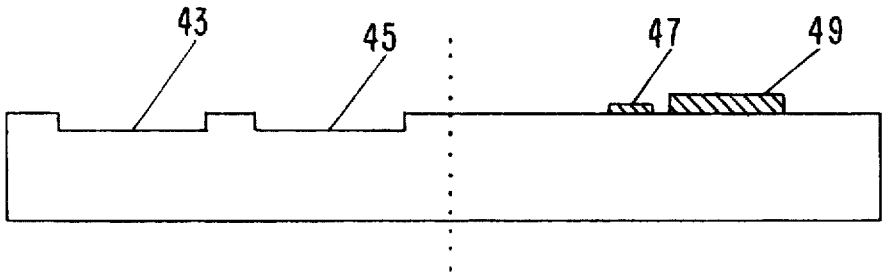
FIG. 15 is a view of a cross section of a phase-amplitude mask in accordance with an embodiment of the invention.
Figure 16:
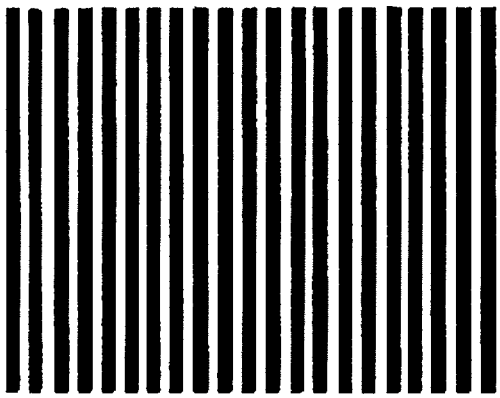
FIGS. 16–19 are schematic views of exposure stages illustrating the process of making an interdigitated or interleaved structure in accordance with an embodiment of the invention.
Figure 17:
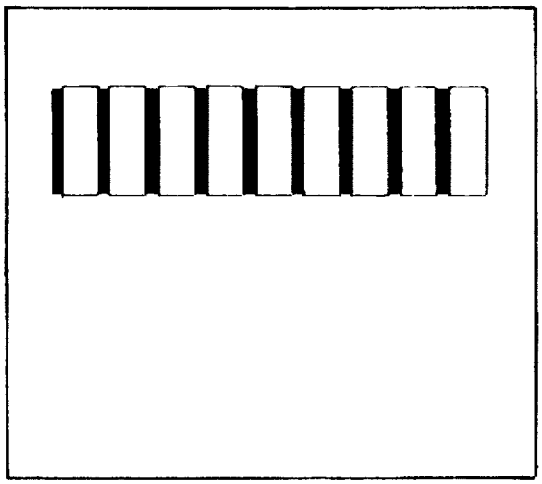
Figure 18:
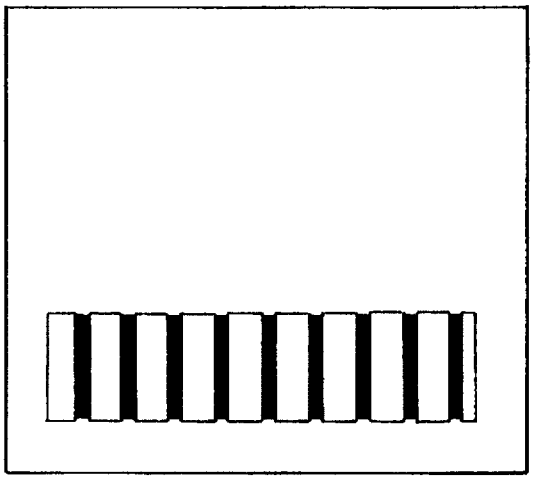
Figure 19:
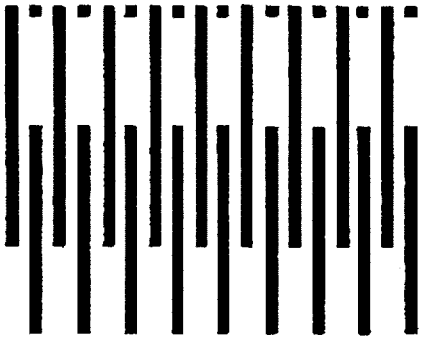

An example of patterning employing a mask is provided in the highly useful, interleaved or interdigitated structure shown in the embodiment of the invention of FIGS. 16–19. The end result pattern shown in FIG. 19 is produced by first exposing a 1-μm pitch grating over the entire area of the photoresist to produce the exposed photoresist image pattern shown in FIG. 167. Next, two sequential exposures are made through a simple shadow mask (e.g., a mask such as is shown in FIG. 15 with either shadow portion 47 or 49) at twice the pitch (2 μm) over the top and bottom halves of the wafer as shown in FIGS. 17 and 18.

The wafer is then translated by 1 μm between these two later exposures so that alternate lines of the original grating are eliminated above and below the pattern to produce the pattern shown in FIG. 19.

Figure 20:
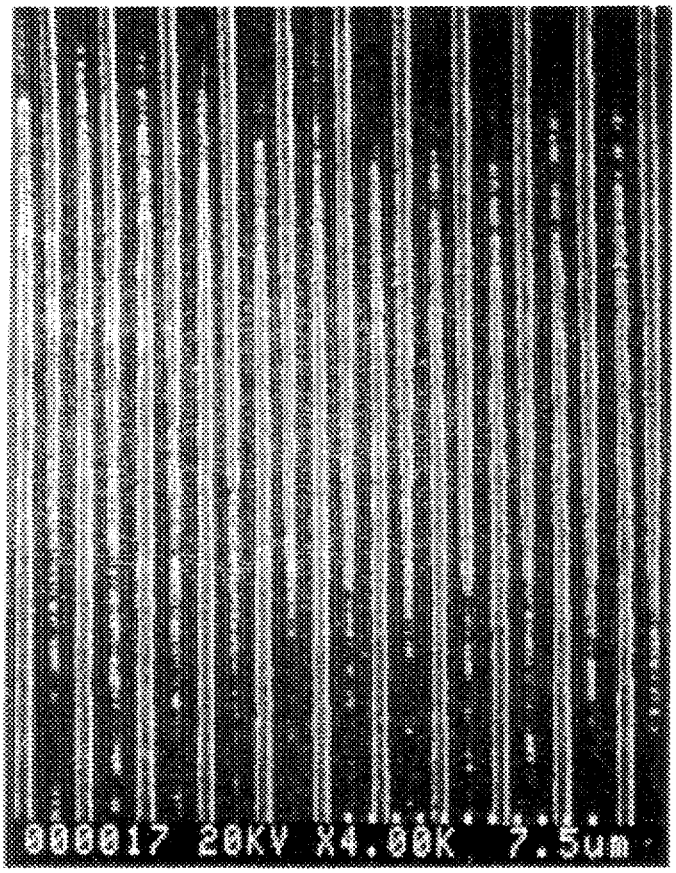
FIG. 20 is a SEM view of an interdigitated structure produced by the method outlined.

The structure shown in the SEM of FIG. 20 was fabricated by the foregoing process. The following Table II shows the steps taken to produce the image shown in FIG. 20. In this case, the image in the photosensitive layer 13 is essentially the same as the image produced by plasma etching, and in producing the image, the wafer was not rotated about axis 29 and instead was translated and apertures were located in the position 33 as shown in FIG. 2.

TABLE II

| FIG No. | Exp | Period (μm) | Translation (μm) | Beam Angle (deg.) | Aperture location |
|---|---|---|---|---|---|
| 20 | first | 1.0 | 0.0 | 14 | none |
| | second | 2.0 | 0.0 | 7 | top |
| | third | 2.0 | 1.0 | 7 | bottom |

Such an interdigitated structure with submicrometer spaces of about 100 nm between the fingers has application, for example, as a large area submicrometer particle detector by fabricating an interdigitated metal grid structure and monitoring the conductivity induced by small numbers of particles shorting out the fingers.

Except for the arrangement of the present invention, no other technique exists that can be used to economically fabricate these interleaved structures over very large areas with extreme sub-micrometer dimensions. These structures are also useful for high-speed optical detectors where the transit times across the sub-micrometer gap determines the detector speed. Indeed, this interdigitated structure is commonly used for a wide array of sensors. The capability provided by interferometric lithography of the present invention will enhance the functionality of many of these devices.

Figure 21:
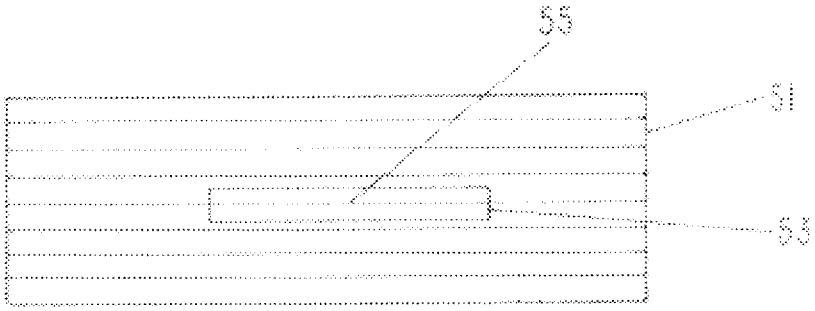
FIG. 21 is an illustration of an embodiment of the invention when used in combination with conventional imaging lithography to produce a single, isolated line constituting the pattern.

Reference is now made to FIG. 21 which shows an embodiment of the invention used in combination with conventional lithography. In general, the combining of the interferometric lithography of the present invention with conventional imaging lithography adds other possibilities to the structures that may be fabricated. As one example, FIG. 21 illustrates the fabrication of an isolated line with a submicrometer critical dimension (CD) using a relatively coarse pitch (say 1–2 μm) grating structure and isolating a single line with a box defined by conventional lithography. Specifically, as shown in the figure, a grating 51 is exposed on the photosensitive layer using a 1 μm pitch. The next exposure is made via a mask to provide a 1.5 μm wide box 53 which masks out the other lines of the grating. The end result is the desired single line 55 which will result after appropriate fabrication such as plasma etching.

Single lines have immediate use, for example, as the gate structure in high-speed field-effect transistors (FET). Commercial devices currently have gate dimensions of ~0.25 μm, fabricated by e-beam lithography. Laboratory research devices have been made with gates as small as 5 nm using focused ion-beam lithography. Both of these are serial processes in which each gate must be written sequentially resulting in low throughput and yield. The present invention offers the possibility of parallel writing of submicrometer gates throughout a large field of view circuit or set of circuits, very much as integrated circuits are conventionally fabricated. This will result in dramatically reduced manufacturing cost and improved yield.

We claim:

1. In microelectronic processing, the method of producing a two-dimensional complex pattern on a photosensitive layer said pattern containing structures with dimensions in the extreme submicron range, comprising the steps of:

a) exposing the photosensitive layer for a first time to two beams of coherent radiation which form an image of a first interference pattern on the surface of said layer;

b) exposing the photosensitive layer for at least one subsequent time to two beams of coherent radiation which form an image of at least one subsequent interference pattern, such that said subsequent interference pattern or patterns referenced to the photosensitive layer are each different from the first pattern;

c) isolating desired regions of said complex pattern with a further exposure of the photosensitive layer using any conventional lithography.

2. The method of claim 1 wherein the photosensitive layer is rotated between exposures such that each subsequent interference pattern differs in rotational orientation relative to said first interference pattern.

3. The method of claim 1 wherein the photosensitive layer is translated between exposures such that each subsequent interfere pattern is offset from said first interference pattern.

4. The method of claim 1 wherein the photosensitive layer is both rotated and translated between exposures such that each subsequent interference pattern different from said first interference pattern in both rotational orientation and in translational position.

5. The method of claim 1 wherein at least one of said beams of the second or subsequent exposures of the photosensitive layer is varied in amplitude such that each subsequent interference pattern differs from said first interference pattern.

6. The method of claim 1 wherein at least one of said beams of the second or subsequent exposures of the photosensitive layer is varied in phase such that each subsequent interference pattern differs from said first interference pattern.

7. The method of claim 1 wherein at least one of said beams of the second or subsequent exposures of the photosensitive layer is varied in phase and amplitude such that each subsequent interference pattern differs from said first interference pattern.

8. The method of claim 1 wherein the periodicity of the interference pattern of at least one said second or subsequent exposures of the photosensitive layer is varied such that each subsequent interference pattern differs from said first interference pattern.

9. In microelectronic processing, the method of producing a single isolated line of extreme submicron dimensions on a photosensitive layer comprising the steps of:

a) exposing the photosensitive layer for a first time to two beams of coherent radiation such that an image of an interference pattern is formed on said layer;

b) isolating a portion of a single line within said interference pattern by a second exposure of the photosensitive layer using conventional optical lithography.

10. In microelectronic processing, a method of producing interdigitated structures on a photosensitive layer, comprising the steps of:

a) exposing a defined area of the photosensitive layer with a first interference pattern, having a period p1, said defined area being bounded by two side edges approximately parallel to the lines of constant exposure dose and by top and bottom edges approximately perpendicular to the lines of constant exposure dose;

b) exposing a second defined area containing the top edge of the first defined area with a second interference pattern of period p2 equal to twice p1 and with lines of constant exposure parallel to those of the first interference pattern, said second interference pattern being positioned relative to the first interference pattern such that every other unexposed region of the first exposure pattern within the second defined area is exposed;

c) exposing a third defined area containing the bottom edge of the fist defined area with a third interference pattern of period p2 equal to twice p1 and with lines of constant exposure parallel to those of the first interference pattern, said third interference pattern being positioned relative to the first and second interference patterns such that every other unexposed region of the first exposure pattern within the third defined area is exposed, said unexposed regions being connected to unexposed regions alternate to those exposed in step b.

11. The method of claim 10 wherein the second and third exposures of steps b and c are replaced by a single second exposure of period p2 equal to twice p1 and with lines of constant exposure parallel to those of the first interference pattern, and further, in which both interfering beams of the second exposure pass through a mask with two transparent holes that map the second exposure into two areas at the photosensitive layer containing said top edge and said bottom edge, respectively, there further being a net phase shift of ½ period between the two resulting interference patterns at the photosensitive layer caused by optical path length differences in the transparent mask areas, said interference patterns being disposed to simultaneously expose every other unexposed region of said first exposure within the illuminated areas.

*12. An apparatus for producing a two-dimensional complex pattern on a photosensitive layer, said pattern containing structures with dimensions in the extreme submicron range, comprising:*

*a movable table;*

*a wafer positioned on said movable table, said wafer having a surface; and,*

*a source of coherent radiation which forms subsequent images of interference patterns on said surface of said wafer, said source providing at least two beam paths, said radiation having an amplitude, phase, angle, intensity and periodicity.*

*13. The apparatus of claim 12, wherein said table communicates with a means for rotation and a means for translation.*

*14. The apparatus of claim 12, wherein said wafer has a photosensitive layer and a substrate.*

*15. The apparatus of claim 12, wherein said source has a means for varying the amplitude of said radiation, a means for varying the phase of said radiation, a means for varying the angle of said radiation, a means for varying the optical intensity of said radiation and a means for varying the periodicity of said interference pattern.*

*16. The apparatus of claim 12, further comprising a means for dividing said coherent radiation into said beam paths, each of said beam paths having coherent radiation of essentially equal intensity at said wafer, thereby assuring a high contrast exposure.*

*17. The apparatus of claim 12, further comprising a phase-amplitude mask, said mask intercepting at least one of said beam paths.*

*18. A method for producing a two-dimensional complex pattern on a photosensitive layer, with dimensions in the extreme submicron range, in a stepwise manner by reducing the field aperture to increase the source coherence.*

* * * * *